(12) United States Patent
Edwards

(10) Patent No.: US 9,508,707 B2
(45) Date of Patent: Nov. 29, 2016

(54) QUANTUM WELL-MODULATED BIPOLAR JUNCTION TRANSISTOR

(71) Applicant: Texas Instruments Incorporated, Dallas, TX (US)

(72) Inventor: Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 115 days.

(21) Appl. No.: 14/630,727

(22) Filed: Feb. 25, 2015

(65) Prior Publication Data

US 2015/0243648 A1 Aug. 27, 2015

Related U.S. Application Data

(60) Provisional application No. 61/945,442, filed on Feb. 27, 2014.

(51) Int. Cl.

| | | |
|---|---|---|
| H01L 21/00 | (2006.01) | |
| H01L 27/00 | (2006.01) | |
| H01L 29/00 | (2006.01) | |
| H01L 27/06 | (2006.01) | |
| H01L 29/739 | (2006.01) | |
| H01L 21/8249 | (2006.01) | |
| H03K 17/66 | (2006.01) | |
| H01L 21/8228 | (2006.01) | |
| H01L 27/082 | (2006.01) | |
| H01L 29/66 | (2006.01) | |
| H01L 29/735 | (2006.01) | |
| H01L 29/10 | (2006.01) | |

(52) U.S. Cl.
CPC ....... *H01L 27/0623* (2013.01); *H01L 21/8228* (2013.01); *H01L 21/8249* (2013.01); *H01L 27/082* (2013.01); *H01L 29/1008* (2013.01); *H01L 29/6625* (2013.01); *H01L 29/735* (2013.01); *H01L 29/7393* (2013.01); *H03K 17/66* (2013.01)

(58) Field of Classification Search
CPC .......... H01L 21/8249; H01L 21/8228; H01L 21/02439; H01L 21/02521; H01L 21/0245; H01L 27/0623; H01L 27/082; H01L 27/0688; H01L 27/10802; H01L 27/108; H01L 29/7393; H01L 29/1008; H01L 29/6625; H01L 29/735; H01L 29/068; H01L 29/125; H03K 17/66; H03K 17/79; H03K 17/795
See application file for complete search history.

(56) References Cited

U.S. PATENT DOCUMENTS 6,465,289 B1 * 10/2002 Streit .................. H01L 21/8252
257/E21.697

(Continued)

*Primary Examiner* — Nikolay Yushin
(74) *Attorney, Agent, or Firm* — Jacqueline J. Garner; Frank D. Cimino

(57) ABSTRACT

A semiconductor device includes a quantum well-modulated bipolar junction transistor (QW-modulated BJT) having a base with an area for a modulatable quantum well in the base. The QW-modulated BJT includes a quantum well (QW) control node which is capable of modulating a quantity and level of energy levels of the quantum well. A recombination site abuts the area for the quantum well with a contact area of at least 25 square nanometers. The semiconductor device may be operated by providing a reference node such as ground to the emitter and a power source to the collector. A bias voltage is provided to the gate to form the quantum well and a signal voltage is provided to the gate, so that the collector current includes a component which varies with the signal.

20 Claims, 6 Drawing Sheets

(56) References Cited

U.S. PATENT DOCUMENTS 6,479,844 B2 * 11/2002 Taylor ............... B82Y 20/00
257/192

6,845,034 B2 * 1/2005 Bhattacharyya .. H01L 21/28194
257/E21.411

9,306,017 B2 * 4/2016 van den
Oever ............... H01L 29/42316

* cited by examiner

QUANTUM WELL-MODULATED BIPOLAR JUNCTION TRANSISTOR

CROSS-REFERENCE TO RELATED APPLICATIONS

This application claims the benefit of priority under U.S.C. §119(e) of U.S. Provisional Application 61/945,442, filed Feb. 27, 2014, which is hereby incorporated by reference in its entirety.

FIELD OF THE INVENTION

This invention relates to the field of semiconductor devices. More particularly, this invention relates to bipolar junction transistors in semiconductor devices.

BACKGROUND OF THE INVENTION

Components and circuits which process small signals, such as amplifiers and mixers, are commonly used in semiconductor devices. It is desirable to reduce the size and power of the small signal processing components. It is also desirable to reduce the fabrication cost and complexity of integrating the small signal components with other components in the semiconductor device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device includes a quantum well-modulated bipolar junction transistor (QW-modulated BJT). The QW-modulated BJT is a bipolar junction transistor having a base with an area for a modulatable quantum well in the base. The QW-modulated BJT includes a quantum well (QW) control node which is capable of modulating a quantity and energy of energy levels of the quantum well. A recombination site abuts the area for the quantum well with a contact area of at least 25 square nanometers.

The semiconductor device may be formed by providing a substrate comprising a silicon-containing semiconductor material, forming a gate dielectric layer on a top surface of the substrate over a region of the semiconductor material having a first conductivity type, and forming a gate over the gate dielectric layer having at least one lateral dimension less than 40 nanometers. Heavily doped barriers of the first conductivity type are formed in the substrate adjacent to the gate. A collector having a second, opposite, conductivity type is formed in the substrate adjacent to one of the barriers, and an emitter having the second conductivity type is formed in the substrate adjacent to another of the barriers.

The semiconductor device may be operated by providing a reference node to the emitter and a power source to the collector. A bias voltage is provided to the QW control node to form the quantum well, and a signal voltage is provided to the gate, so that the collector current includes a component which varies with the signal.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device includes a QW-modulated BJT having a base with an area for a modulatable quantum well in the base. The QW-modulated BJT includes a QW control node which is capable of modulating a quantity and level of energy levels of the quantum well. A recombination site abuts the area for the quantum well with a contact area of at least 25 square nanometers.

The semiconductor device may be formed by providing a substrate comprising a silicon-containing semiconductor material with a top surface. A gate dielectric layer is formed at the top surface of the substrate over a region of the semiconductor material having a first conductivity type. The gate dielectric layer provides the recombination site. A gate is formed over the gate dielectric layer having at least one lateral dimension less than 40 nanometers. The gate provides the QW control node. Heavily doped barriers of the first conductivity type are formed in the substrate adjacent to the gate. Boundaries of the barriers define lateral extents of the area for the quantum well under the gate. A collector having a second, opposite, conductivity type is formed in the substrate adjacent to one of the barriers, and an emitter having the second conductivity type is formed in the substrate adjacent to another of the barriers.

The semiconductor device may be operated by providing a reference node such as ground to the emitter and a power source to the collector. A bias voltage is provided to the gate to form the quantum well and a signal voltage is provided to the gate, so that the collector current includes a component which varies with the signal.

Figure 1:
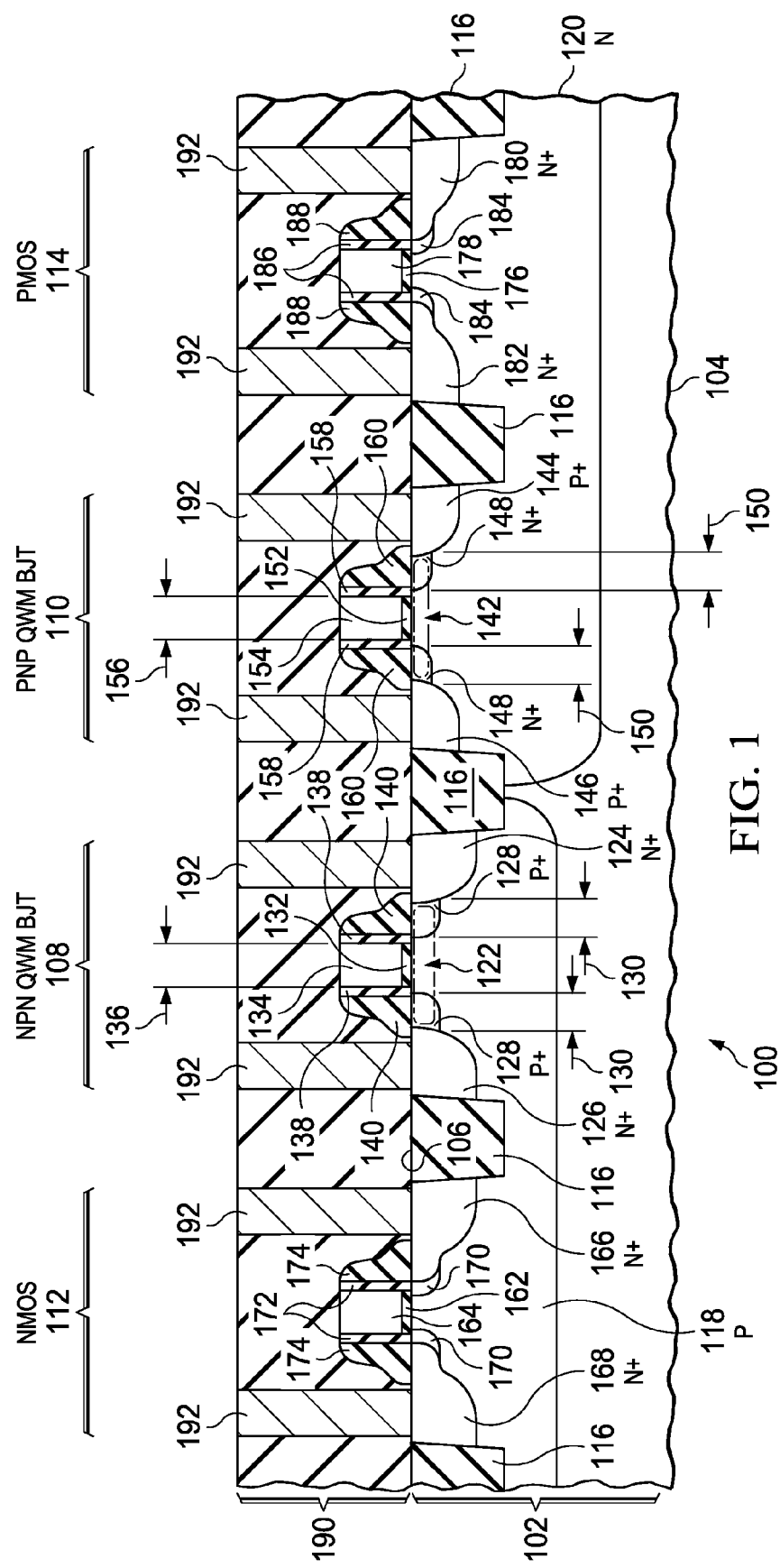
FIG. 1 is a cross section of an example semiconductor device containing a QW-modulated BJT.

FIG. 1 is a cross section of an example semiconductor device containing a QW-modulated BJT. The semiconductor device 100 is formed in and on a substrate 102 which includes a silicon-containing Group IV semiconductor material 104 extending to a top surface 106 of the substrate 102. Silicon-containing Group IV semiconductor material includes silicon, silicon-germanium and silicon-carbon. In the instant example, the semiconductor device includes an NPN QW-modulated BJT 108 and a PNP QW-modulated BJT 110, as well as an n-channel metal oxide semiconductor (NMOS) transistor 112 and a p-channel metal oxide semiconductor (PMOS) transistor 114. Field oxide 116 may be disposed at the top surface 106 so as to laterally isolate the QW-modulated BJTs 108 and 110 and the transistors 112 and 114 in the substrate 102. A p-type well 118 is disposed in the substrate 102 in areas for the NPN QW-modulated BJT 108 and the NMOS transistor 112. An n-type well 120 is disposed in the substrate 102 in areas for the PNP QW-modulated BJT 110 and the PMOS transistor 114.

The p-type well 118 proximate to the top surface 106 provides a base 122 of the NPN QW-modulated BJT 108. The NPN QW-modulated BJT 108 includes an n-type emitter 124 and an n-type collector 126 disposed in the substrate 102, extending to the top surface 106, laterally adjacent to, and on separate sides of the base 122. Heavily doped p-type barriers 128 are disposed in the base 122, abutting the emitter 124 and collector 126. A space in the base 122 between the barriers 128 provides an area for a quantum well of the NPN QW-modulated BJT 108. An average doping of the space in the base 122 between the barriers 128 may be $1 \times 10^{15}$ cm$^{-3}$ to $3 \times 10^{18}$ cm$^{-3}$. The barriers 128 have average net doping densities greater than $3 \times 10^{18}$ cm$^{-3}$, and widths 130 greater than 10 nanometers. A gate dielectric layer 132 is disposed on the top surface 106 over the area for the quantum well. The gate dielectric layer 132 may include one or more layers of silicon dioxide, hafnium oxide, and/or zirconium oxide, and may be nitridated. A gate 134 is disposed over the gate dielectric layer 132. The gate 134 provides a quantum well control node 134 for the quantum well. The gate 134 has a physical width 136 less than 40 nanometers. The gate dielectric layer 132 provides a recombination site 132 abutting the area for the quantum well with a contact area of at least 25 square nanometers. The gate 134 may include polycrystalline silicon, referred to herein as polysilicon, or may include layers of metal as provided by a replacement gate process. Optional thin offset spacers 138 and/or thick sidewall spacers 140 may be disposed adjacent to the gate 134, over the barriers 128. The offset spacers 138 and the sidewall spacers 140 may include one or more layers of silicon dioxide and/or silicon nitride.

The n-type well 120 proximate to the top surface 106 provides a base 142 of the PNP QW-modulated BJT 110. The PNP QW-modulated BJT 110 includes a p-type emitter 144 and a p-type collector 146 disposed in the substrate 102, extending to the top surface 106, laterally adjacent to, and on separate sides of the base 142. Heavily doped n-type barriers 148 are disposed in the base 142, abutting the emitter 144 and collector 146. A space in the base 142 between the barriers 148 provides an area for a modulatable quantum well of the PNP QW-modulated BJT 110. An average doping of the space in the base 142 between the barriers 148 may be $1 \times 10^{15}$ cm$^{-3}$ to $3 \times 10^{18}$ cm$^{-3}$. The barriers 148 have average net doping densities greater than $3 \times 10^{18}$ cm$^{-3}$, and widths 150 greater than 10 nanometers. A gate dielectric layer 152 is disposed on the top surface 106 over the area for the quantum well. The gate dielectric layer 152 may include one or more layers of silicon dioxide, hafnium oxide, and/or zirconium oxide, and may be nitridated. The gate dielectric layer 152 may have a substantially equal thickness and composition as the gate dielectric layer 132 of the NPN QW-modulated BJT 108 as a result of being formed concurrently. A gate 154 is disposed over the gate dielectric layer 152. The gate 154 provides a quantum well control node 154 for the quantum well. The gate 154 has a physical width 156 less than 40 nanometers. The gate dielectric layer 152 provides a recombination site 152 abutting the area for the quantum well with a contact area of at least 25 square nanometers. The gate 154 may include polysilicon, or may include layers of metal as provided by a replacement gate process. Optional thin offset spacers 158 and/or thick sidewall spacers 160 may be disposed adjacent to the gate 154, over the barriers 148. The offset spacers 158 and the sidewall spacers 160 may include one or more layers of silicon dioxide and/or silicon nitride.

The NMOS transistor 112 includes a gate dielectric layer 162 disposed on the top surface 106 and a gate 164 disposed over the gate dielectric layer 162. The gate dielectric layer 162 and/or the gate 164 may have a similar composition and structure as the gate dielectric layer 132 and gate 134 of the NPN QW-modulated BJT 108, as a result of being formed concurrently. An n-type source 166 and an n-type drain 168 are disposed in the substrate 102 adjacent to the gate 164. The source 166 and the drain 168 include shallow extensions proximate to the gate 164 and deep portions farther away from the gate 164. P-type halo regions 170 are disposed in the substrate 102, partway under the gate 164, abutting the shallow extensions of the source 166 and the drain 168. Optional thin offset spacers 172 and/or thick sidewall spacers 174 may be disposed adjacent to the gate 164. The offset spacers 172 and the sidewall spacers 174 may have substantially equal thicknesses and compositions as the offset spacers 138 and the sidewall spacers 140 of the NPN QW-modulated BJT 108 as a result of being formed concurrently.

The PMOS transistor 114 includes a gate dielectric layer 176 disposed on the top surface 106 and a gate 178 disposed over the gate dielectric layer 176. The gate dielectric layer 176 and/or the gate 178 may have a similar composition and structure as the gate dielectric layer 152 and gate 154 of the PNP QW-modulated BJT 110, as a result of being formed concurrently. A p-type source 180 and a p-type drain 182 are disposed in the substrate 102 adjacent to the gate 178. The source 180 and the drain 182 include shallow extensions proximate to the gate 178 and deep portions farther away from the gate 178. P-type halo regions 184 are disposed in the substrate 102, partway under the gate 178, abutting the shallow extensions of the source 180 and the drain 182. Optional thin offset spacers 186 and/or thick sidewall spacers 188 may be disposed adjacent to the gate 178. The offset spacers 186 and the sidewall spacers 188 may have substantially equal thicknesses and compositions as the offset spacers 158 and the sidewall spacers 160 of the PNP QW-modulated BJT 110 as a result of being formed concurrently.

A pre-metal dielectric (PMD) layer 190 is disposed over the substrate 102. The PMD layer 190 may include one or more layers of silicon dioxide, silicon nitride, and other dielectric materials. Contacts 192 are disposed through the PMD layer 190. The contacts 192 may include a liner of titanium and titanium nitride, and a fill metal of tungsten. Instances of the contacts 192 provide electrical connections to the source 166 and the drain 168 of the NMOS transistor 112 and to the source 180 and the drain 182 of the PMOS transistor 114. Additional instances, not shown in FIG. 1, of the contacts 192 provide electrical connections to the gate 164 of the NMOS transistor 112 and to the gate 178 of the PMOS transistor 114.

Instances of the contacts 192 provide electrical connections to the emitter 124 and collector 126 of the NPN QW-modulated BJT 108. Additional instances, not shown in FIG. 1, of the contacts 192 provides an electrical connections to the gate 134 of the NPN QW-modulated BJT 108 and to the base 122 of the NPN QW-modulated BJT 108 through the p-type well 118. Similarly, instances of the contacts 192 provide electrical connections to the emitter 144 and collector 146 of the PNP QW-modulated BJT 110.

Additional instances, not shown in FIG. 1, of the contacts 192 provides an electrical connections to the gate 154 of the PNP QW-modulated BJT 110 and to the base 122 of the PNP QW-modulated BJT 110 through the n-type well 120.

Forming the NPN QW-modulated BJT 108 and the PNP QW-modulated BJT 110 on the substrate with the silicon-containing semiconductor material 104 may advantageously reduce materials and a fabrication cost and complexity of the semiconductor device 100 compared to using other materials such as III-V materials. Integrating the NPN QW-modulated BJT 108 and the PNP QW-modulated BJT 110 with the NMOS transistor 112 and the PMOS transistor 114 may advantageously reduce a cost of a device using the semiconductor device 100 compared to using separate devices for the NPN QW-modulated BJT 108 and the PNP QW-modulated BJT 110, and for the NMOS transistor 112 and the PMOS transistor 114.

During operation of the semiconductor device 100, a positive voltage may be applied to the gate 134 of the NPN QW-modulated BJT 108 with respect to a voltage on the base 122, inverting the semiconductor material of the p-type well 118 immediately below the gate dielectric layer 132 to form a modulatable quantum well. Varying the voltage on the gate 134 moves the energy levels of the quantum well to higher and lower energies. Electrons in energy levels of the quantum well may recombine at the gate dielectric layer 132. Similarly, a negative voltage may be applied to the gate 154 of the PNP QW-modulated BJT 110 with respect to a voltage on the base 142, inverting the semiconductor material of the n-type well 120 immediately below the gate dielectric layer 152 to form a modulatable quantum well. Varying the voltage on the gate 154 moves the energy levels of the quantum well to higher and lower energies. Holes in energy levels of the quantum well may recombine at the gate dielectric layer 152. The physical width 136 of the gate 134 being less than 40 nanometers may advantageously provide energy separations between energy levels in the quantum well of the NPN QW-modulated BJT 108 greater than thermal energy, which is a product of Boltzmann's constant, $1.38 \times 10^{-23}$ joules/° K, and the temperature of the QW-modulated BJT 302 in ° K, referred to herein as "kT". At room temperature, about 295° K, kT is about $4.0 \times 10^{-21}$ joules, which may be alternately expressed as 25 milli-electron-volts (meV). At the boiling point of liquid nitrogen, about 77° K, kT is about $1.06 \times 10^{-21}$ joules, that is, 6.6 meV. Having energy separations greater than thermal energy allows a desired mode of operation in which energy levels which are de-populated by recombination are not quickly re-populated by thermal excitation from other energy levels.

Figure 2A:
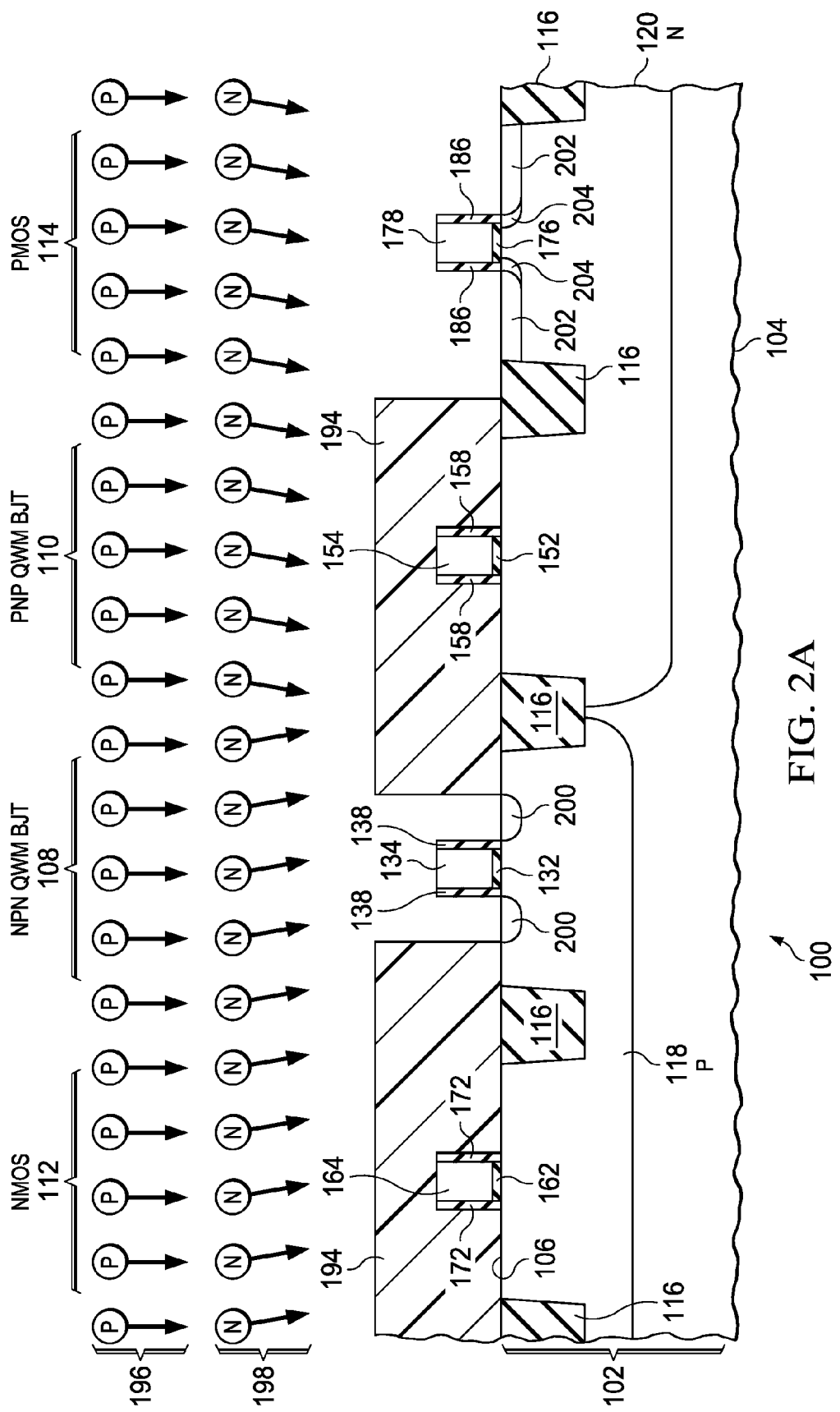
FIG. 2A through FIG. 2D are cross sections of the semiconductor device of FIG. 1, depicted in key stages of an example fabrication sequence.

FIG. 2A through FIG. 2D are cross sections of the semiconductor device of FIG. 1, depicted in key stages of an example fabrication sequence. Referring to FIG. 2A, the substrate 102 may be, for example, a silicon wafer, possibly with an epitaxial layer to provide the silicon-containing semiconductor material 104. The field oxide 116 may be formed by a shallow trench isolation (STI) process. The p-type well 118 may be formed by implanting boron at a dose of $3 \times 10^{12}$ cm$^{-2}$ to $1 \times 10^{14}$ cm$^{-2}$ and an energy of 120 keV to 220 keV. Additional p-type dopants such as boron and indium may be implanted at lower energies to improve performance of the NMOS transistor 112 and to provide a doping density of the p-type well 118 proximate to the top surface 106 in the area for the NPN QW-modulated BJT 108 of $1 \times 10^{15}$ cm$^{-3}$ to $3 \times 10^{18}$ cm$^{-3}$. The n-type well 120 may be formed by implanting phosphorus at a dose of $3 \times 10^{12}$ cm$^{-2}$ to $1 \times 10^{14}$ cm$^{-2}$ and an energy of 250 keV to 400 keV. Additional n-type dopants such as phosphorus and arsenic may be implanted at lower energies to improve performance of the PMOS transistor 114 and to provide a doping density of the n-type well 120 proximate to the top surface 106 in the area for the PNP QW-modulated BJT 110 of $1 \times 10^{15}$ cm$^{-3}$ to $3 \times 10^{18}$ cm$^{-3}$. A subsequent anneal activates the implanted dopants.

The gate dielectric layers 132, 152, 162 and 178 of the NPN QW-modulated BJT 108, the PNP QW-modulated BJT 110, the NMOS transistor 112 and the PMOS transistor 114, respectively, may be formed concurrently or separately. Each of the gate dielectric layers 132, 152, 162 and 178 may be formed by thermal oxidation, optionally followed by exposure to a nitrogen-containing plasma to nitridate the thermal oxide, and/or by deposition of dielectric material such as hafnium oxide or zirconium oxide. The gates 134, 154, 164 and 176 of the NPN QW-modulated BJT 108, the PNP QW-modulated BJT 110, the NMOS transistor 112 and the PMOS transistor 114, respectively, may be formed concurrently or separately. Each of the gates 134, 154, 164 and 176 may be formed by etching a layer of polysilicon using a reactive ion etch (RIE) process and a gate etch mask of silicon nitride, amorphous carbon or other hard mask materials. The offset spacers 138, 158, 172 and 186 of the NPN QW-modulated BJT 108, the PNP QW-modulated BJT 110, the NMOS transistor 112 and the PMOS transistor 114, respectively, may be formed concurrently or separately. The offset spacers 138, 158, 172 and 186 may be formed by thermal oxidation of polysilicon in the gates 134, 154, 164 and 178, followed by deposition of ore or more conformal layers of silicon dioxide and/or silicon nitride by plasma enhanced chemical vapor deposition (PECVD) processes using tetraethyl orthosilicate, also known as tetraethoxy silane (TEOS) and bis(tertiary butyl amino) silane (BT-BAS), respectively. A subsequent anisotropic plasma etch may remove dielectric material from horizontal surfaces of the gates 134, 154, 164 and 178 and the substrate 102, leaving the offset spacers 138, 158, 172 and 186.

A first implant mask 194 is formed over the top surface 106 of the substrate 102, so as to expose the NPN QW-modulated BJT 108 and the PMOS transistor 114, and to cover the PNP QW-modulated BJT 110 and the NMOS transistor 112. The first implant mask 194 may include photoresist formed by a photolithographic process, and may also include an anti-reflection layer such as a bottom anti-reflection coat (BARC).

P-type dopants 196 such as boron, possibly in the form of $BF_2$, and indium, and possibly gallium, are implanted into the substrate 102 adjacent to the gate 134 of the NPN QW-modulated BJT 108 to form barrier implanted regions 200, and adjacent to the gate 178 of the PMOS transistor 114 to form source/drain extension implanted regions 202. The p-type dopants 196 are implanted at a low tilt angle, less than 2 degrees, and the gates 134 and 178 and the offset spacers 138 and 186 effectively block the p-type dopants 196, so that the barrier implanted regions 200 do not extend significantly under the offset spacers 138 and the source/drain extension implanted regions 202 do not extend significantly under the offset spacers 186. The p-type dopants may be implanted at a total dose of $1 \times 10^{14}$ cm$^{-2}$ to $5 \times 10^{15}$ cm$^{-2}$, and at an energy to place a peak of the implanted dopants at a depth of 10 nanometers to 100 nanometers below the top surface 106 of the substrate 102.

N-type dopants 198 such as phosphorus and arsenic, and possibly antimony, are implanted in more than one step at tilt angles above 15 degrees into the substrate 102 adjacent to the gate 178 of the PMOS transistor 114 to form halo implanted regions 204 partway under the gate 178, abutting the source/drain extension implanted regions 202. The n-type dopants 198 may be implanted at a total dose of $1\times10^{13}$ cm$^{-2}$ to $1\times10^{14}$ cm$^{-2}$, and at an energy to place a peak of the implanted dopants at a depth of 10 nanometers to 100 nanometers below the top surface 106 of the substrate 102. In the instant example, the first implant mask 194 is formed close to the gate 134 of the NPN QW-modulated BJT 108, so that the n-type dopants 198 are effectively blocked from the substrate 102 adjacent to the gate 134 by the combination of the first implant mask 194 and the gate 134.

Forming the barrier implanted regions 200 concurrently with the source/drain extension implanted regions 202 may advantageously reduce the fabrication cost and complexity of the semiconductor device 100. Blocking the n-type dopants 198 from the barrier implanted regions 200 may advantageously improve performance of the NPN QW-modulated BJT 108.

Other species such as carbon or fluorine may be implanted while the first implant mask 194 is in place. The first implant mask 194 is subsequently removed, for example by an ash process followed by a wet clean process. The implanted dopants 196 and 198 may be activated by a short thermal process such as a spike anneal or a flash anneal.

Figure 2B:
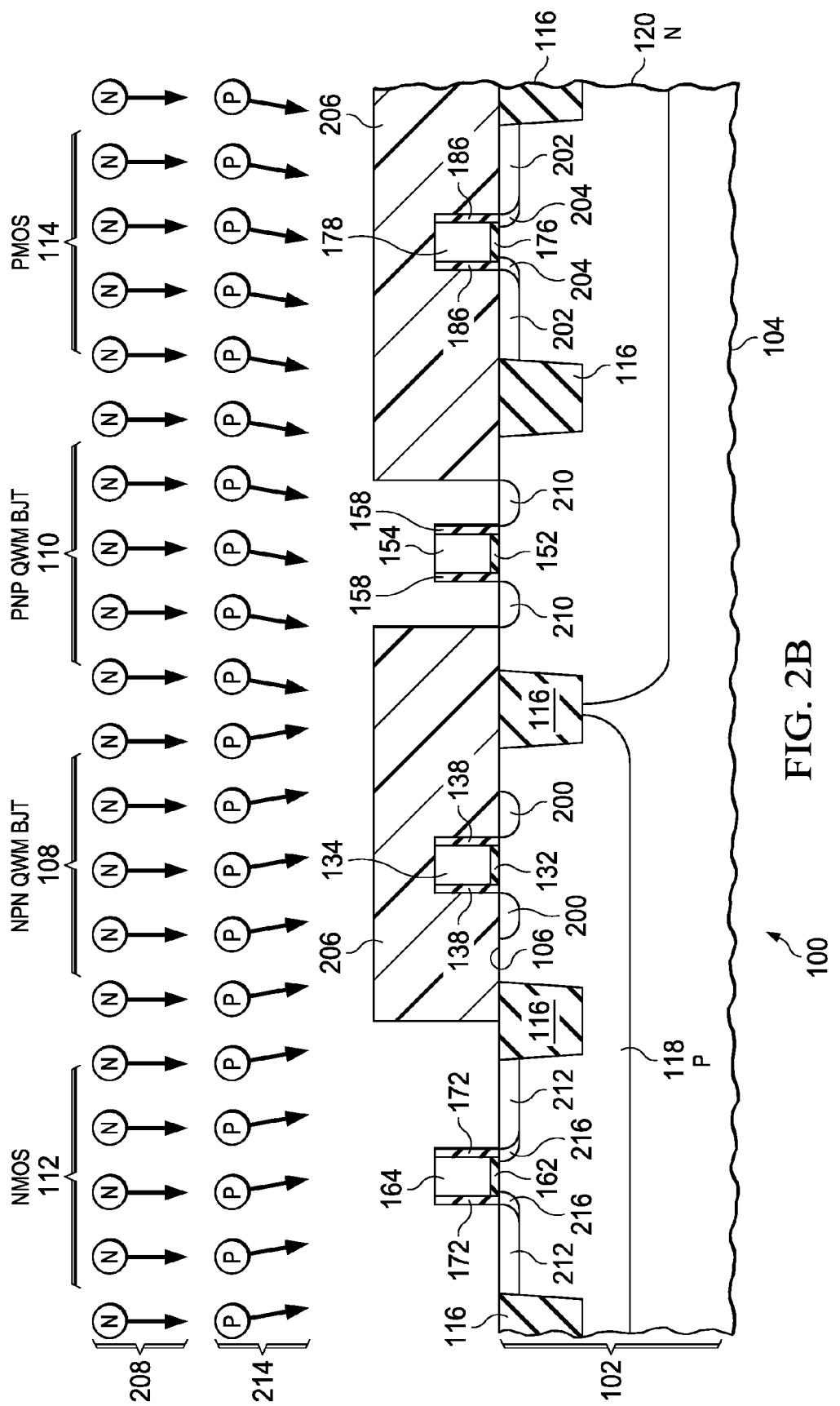

Referring to FIG. 2B, a second implant mask 206 is formed over the top surface 106 of the substrate 102, so as to expose the PNP QW-modulated BJT 110 and the NMOS transistor 112, and to cover the NPN QW-modulated BJT 108 and the PMOS transistor 114. The second implant mask 206 may be formed similarly to the first implant mask 194 of FIG. 2A.

N-type dopants 208 such as phosphorus, and possibly arsenic, are implanted into the substrate 102 adjacent to the gate 154 of the PNP QW-modulated BJT 110 to form barrier implanted regions 210, and adjacent to the gate 164 of the NMOS transistor 112 to form source/drain extension implanted regions 212. The n-type dopants 208 are implanted at a low tilt angle, less than 2 degrees, and the gates 154 and 164 and the offset spacers 158 and 172 effectively block the n-type dopants 208, so that the barrier implanted regions 210 do not extend significantly under the offset spacers 158 and the source/drain extension implanted regions 212 do not extend significantly under the offset spacers 172. The n-type dopants may be implanted at a total dose of $1\times10^{14}$ cm$^{-2}$ to $5\times10^{15}$ cm$^{-2}$, and at an energy to place a peak of the implanted dopants at a depth of 10 nanometers to 100 nanometers below the top surface 106 of the substrate 102.

P-type dopants 214 such as boron, possibly in the form of BF$_2$, and indium, and possibly gallium, are implanted in more than one step at tilt angles above 15 degrees into the substrate 102 adjacent to the gate 164 of the NMOS transistor 112 to form halo implanted regions 216 partway under the gate 164, abutting the source/drain extension implanted regions 212. The p-type dopants 214 may be implanted at a total dose of $1\times10^{13}$ cm$^{-2}$ to $1\times10^{14}$ cm$^{-2}$, and at an energy to place a peak of the implanted dopants at a depth of 10 nanometers to 100 nanometers below the top surface 106 of the substrate 102. In the instant example, the second implant mask 206 is formed close to the gate 154 of the PNP QW-modulated BJT 110, so that the p-type dopants 214 are effectively blocked from the substrate 102 adjacent to the gate 154 by the combination of the second implant mask 206 and the gate 154.

Forming the barrier implanted regions 210 concurrently with the source/drain extension implanted regions 212 may advantageously reduce the fabrication cost and complexity of the semiconductor device 100. Blocking the p-type dopants 214 from the barrier implanted regions 210 may advantageously improve performance of the PNP QW-modulated BJT 110.

Other species such as carbon or fluorine may be implanted while the second implant mask 206 is in place. The second implant mask 206 is subsequently removed, similarly to the first implant mask 194 of FIG. 2A. The implanted dopants 208 and 214 may be activated by a short thermal process similarly to the implanted dopants 196 and 198 of FIG. 2A.

Figure 2C:
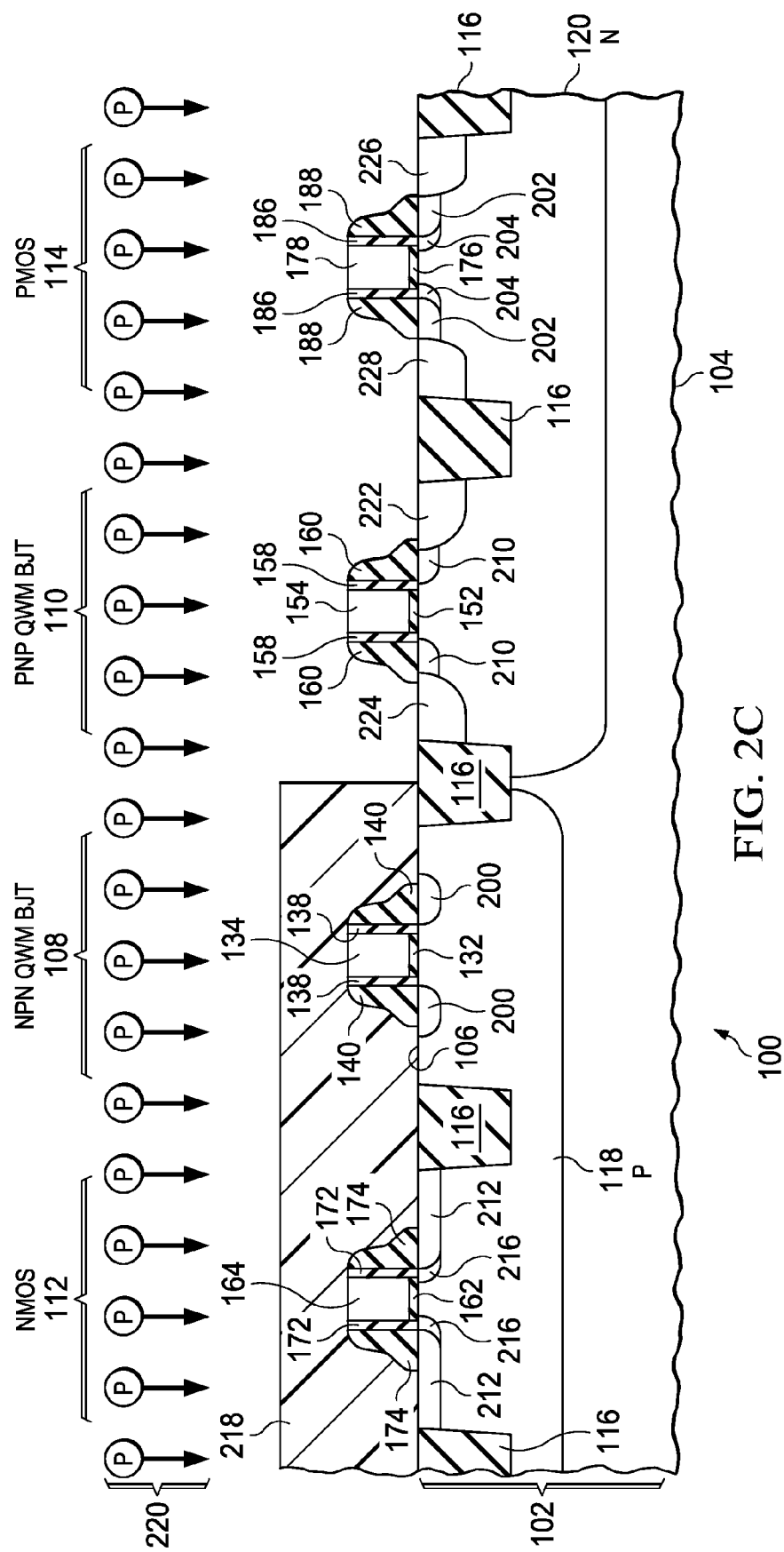

Referring to FIG. 2C, the sidewall spacers 140, 160, 174 and 188 are formed adjacent to the gates 134, 154, 164 and 178, respectively. The sidewall spacers 140, 160, 174 and 188 may be formed by forming one or more conformal layers of silicon nitride and/or silicon dioxide by PECVD processes, followed by an anisotropic plasma etch to remove the silicon dioxide and silicon nitride from tops of the gates 134, 154, 164 and 178, leaving the sidewall spacers 140, 160, 174 and 188. The sidewall spacers 140 of the NPN QW-modulated BJT 108 and the sidewall spacers 174 of the NMOS transistor 112 may be formed concurrently to provide similar spacers for a subsequent n-type dopant implant. Similarly, the sidewall spacers 160 of the PNP QW-modulated BJT 110 and the sidewall spacers 188 of the PMOS transistor 114 may be formed concurrently to provide similar spacers for a subsequent p-type dopant implant.

A third implant mask 218 is formed over the top surface 106 of the substrate 102 so as to expose the PNP QW-modulated BJT 110 and the PMOS transistor 114, and to cover the NPN QW-modulated BJT 108 and the NMOS transistor 112. The third implant mask 218 may be formed similarly to the first implant mask 194 of FIG. 2A and the second implant mask 206 of FIG. 2B.

P-type dopants 220 such as boron are implanted into the substrate 102 adjacent to the sidewall spacers 160 of the PNP QW-modulated BJT 110 to form an emitter implanted region 222 and a collector implanted region 224 on separate sides of the barrier implanted regions 210, and adjacent to the sidewall spacers 188 of the PMOS transistor 114 to form a source implanted region 226 and a drain implanted region 228 on separate sides of the source/drain extension implanted regions 202. The p-type dopants 220 may be implanted in several steps at different doses and energies to provide graded junctions with the n-type well 120, with a total dose of $1\times10^{15}$ cm$^{-2}$ to $1\times10^{16}$ cm$^{-2}$, and energies to provide a final junction depth of 100 nanometers to 300 nanometers. Forming the emitter implanted region 222 and the collector implanted region 224 concurrently with the source implanted region 226 and the drain implanted region 228 may advantageously reduce the fabrication cost and complexity of the semiconductor device 100.

Other species such as carbon or fluorine may be implanted while the third implant mask 218 is in place. The third implant mask 218 is subsequently removed, similarly to the first implant mask 194 of FIG. 2A and the second implant mask 206 of FIG. 2B. The implanted dopants 220 may be activated by a short thermal process such as a spike anneal or a flash anneal.

Figure 2D:
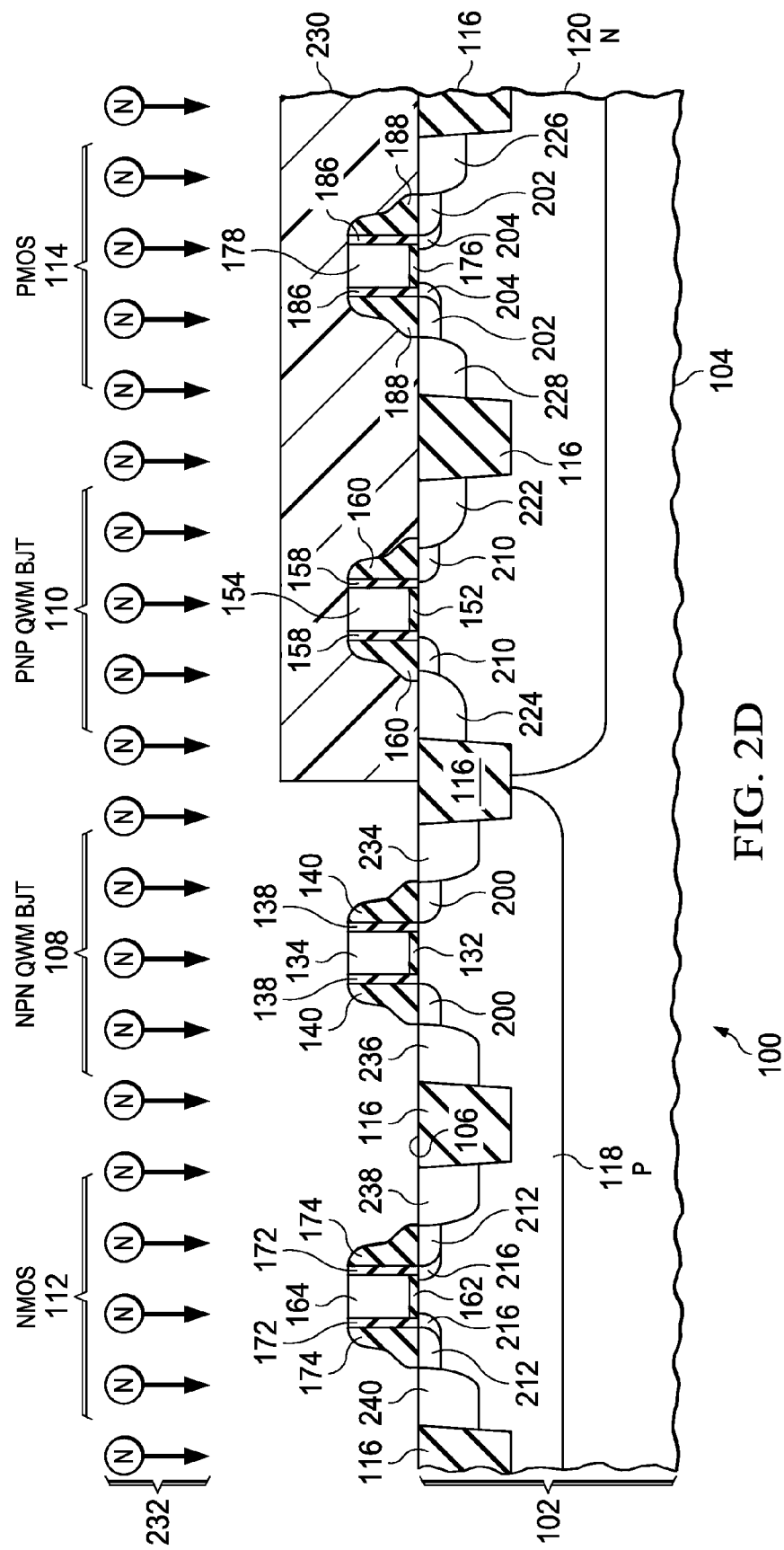

Referring to FIG. 2D, a fourth implant mask 230 is formed over the top surface 106 of the substrate 102 so as to expose the NPN QW-modulated BJT 108 and the NMOS transistor 112, and to cover the PNP QW-modulated BJT 110 and the PMOS transistor 114. The fourth implant mask 230 may be formed similarly to the third implant mask 218 of FIG. 2C.

N-type dopants 232 such as phosphorus and arsenic are implanted into the substrate 102 adjacent to the sidewall spacers 140 of the NPN QW-modulated BJT 108 to form an emitter implanted region 234 and a collector implanted region 236 on separate sides of the barrier implanted regions 200, and adjacent to the sidewall spacers 174 of the NMOS transistor 112 to form a source implanted region 238 and a drain implanted region 240 on separate sides of the source/drain extension implanted regions 212. The n-type dopants 232 may be implanted in several steps at different doses and energies to provide graded junctions with the p-type well 118, with a total dose of $1 \times 10^{15}$ cm$^{-2}$ to $1 \times 10^{16}$ cm$^{-2}$, and energies to provide a final junction depth of 100 nanometers to 300 nanometers. Forming the emitter implanted region 234 and the collector implanted region 236 concurrently with the source implanted region 238 and the drain implanted region 240 may advantageously reduce the fabrication cost and complexity of the semiconductor device 100.

Other species such as carbon or fluorine may be implanted while the fourth implant mask 230 is in place. The fourth implant mask 230 is subsequently removed, similarly to the third implant mask 218 of FIG. 2C. The implanted dopants 232 may be activated by a short thermal process such as a spike anneal or a flash anneal.

Figure 3:
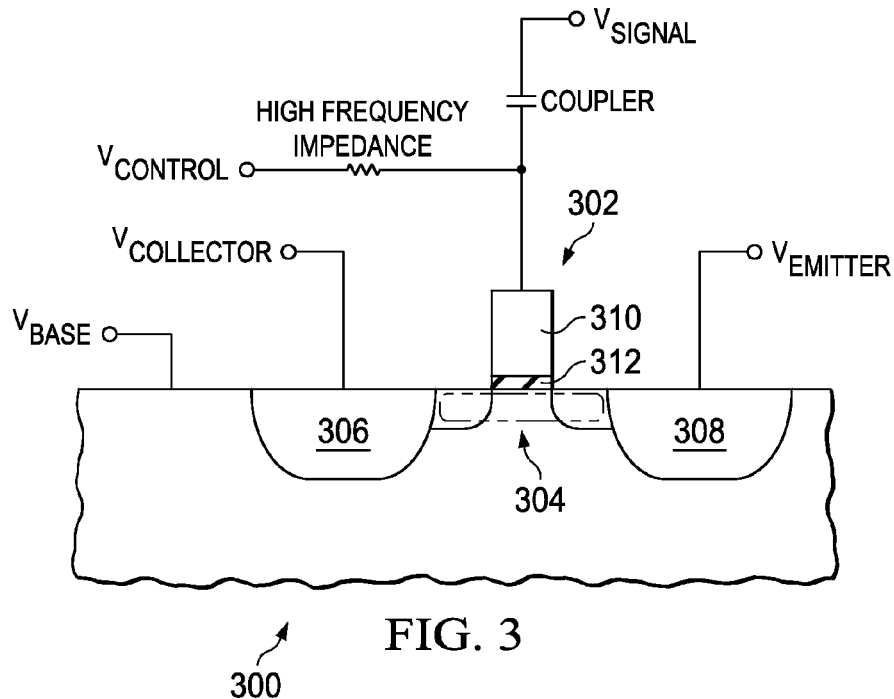
FIG. 3 and FIG. 4 depict example methods of operating a semiconductor device containing a QW-modulated BJT.
Figure 4:
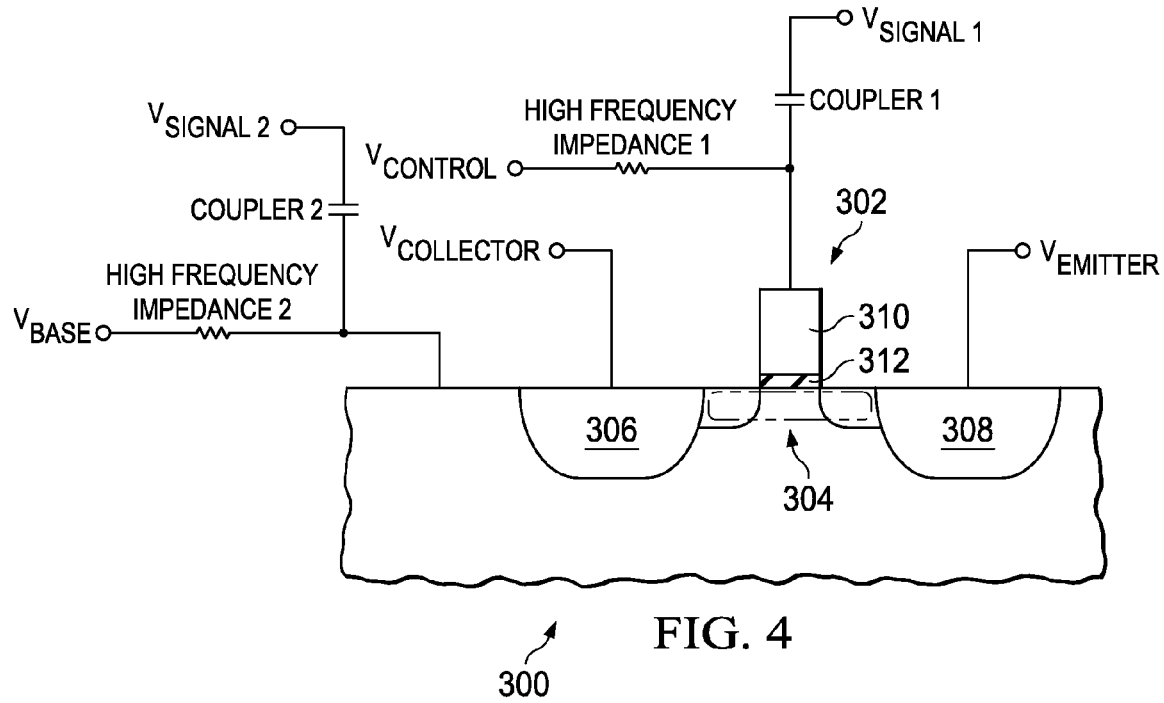

FIG. 3 and FIG. 4 depict example methods of operating a semiconductor device containing a QW-modulated BJT. Referring to FIG. 3, the semiconductor device 300 includes the QW-modulated BJT 302, which may be an NPN QW-modulated BJT or a PNP QW-modulated BJT. The QW-modulated BJT 302 is depicted in FIG. 3 as having a structure similar to the NPN QW-modulated BJT 108 or the PNP QW-modulated BJT 110 of FIG. 1, but may have a different structure. The QW-modulated BJT 302 includes a base 304, a collector 306 and an emitter 308. A QW control node 310 modulates a quantum well in the base 304. A recombination site 312 is electrically coupled to an area for the quantum well with a contact area of at least 25 square nanometers.

In the instant example, the emitter 308 is electrically coupled to a reference node, designated in FIG. 3 as $V_{EMITTER}$, which may be, for example a ground node of the semiconductor device 300. The collector 306 is electrically coupled to a collector power source, designated in FIG. 3 as $V_{COLLECTOR}$, which may be, for example, a direct current (DC) voltage source. The base 304 is electrically coupled to a base power source, designated in FIG. 3 as $V_{BASE}$, which may be, for example, an adjustable DC voltage source. The QW control node 310 is electrically coupled to a DC voltage source, designated in FIG. 3 as $V_{CONTROL}$, which may be an adjustable DC voltage source. A signal source, designated in FIG. 3 as $V_{SIGNAL}$, is electrically coupled to the QW control node 310, possibly through a coupler, designated in FIG. 3 as COUPLER, which may be, for example a capacitor in combination with a high frequency impedance component, designated in FIG. 3 as HIGH FREQUENCY IMPEDANCE, which may be a resistor.

During operation of the semiconductor device 300, a voltage on the collector power source $V_{COLLECTOR}$ is set to reverse bias a junction between the collector 306 and the base 304, and a voltage on the base power source $V_{BASE}$ is set to forward bias a junction between the base 304 and the emitter 308. For an NPN QW-modulated BJT, the voltage on the collector power source $V_{COLLECTOR}$ is positive with respect to the voltage on the base power source $V_{BASE}$ and the voltage on the base power source $V_{BASE}$ is positive with respect to the reference node $V_{EMITTER}$. For a PNP QW-modulated BJT, the voltage on the collector power source $V_{COLLECTOR}$ is negative with respect to the voltage on the base power source $V_{BASE}$ and the voltage on the base power source $V_{BASE}$ is negative with respect to the reference node $V_{EMITTER}$.

A voltage at $V_{CONTROL}$ coupled to the QW control node 310 is set to form a quantum well in the base 304 with one or more discrete energy levels, separated by more than thermal energy. The quantum well in an NPN QW-modulated BJT has energy levels for electrons; conversely, the quantum well in a PNP QW-modulated BJT has energy levels for holes. The voltage at $V_{CONTROL}$ may be at a value so that one of the energy levels in the quantum well is within kT of the Fermi level in the quantum well. Electrons (holes) in that energy level may be confined in the quantum well so as to have a higher probability of recombining at the recombination site, compared to electrons (holes) in energy levels that are separated from the Fermi level by more than kT. Charge to recombine with the electrons (holes) from the quantum well is provided by increased base current. The bipolar junction transistor of the QW-modulated BJT thus has a reduced gain due to this increased base current compared to an operating condition in which the voltage at $V_{CONTROL}$ is at a value so that none of the energy levels in the quantum well are within kT of the Fermi level in the quantum well. The voltage at $V_{CONTROL}$ may be adjusted so that a small increase in a voltage on the signal source $V_{SIGNAL}$ causes an energy level in the quantum well to move closer to the Fermi level, causing a reduction in current through the collector 306, and a small decrease in the voltage on the signal source $V_{SIGNAL}$ causes the energy level to move farther away from the Fermi level, resulting in an increase in current through the collector 306. Such an operating mode of the QW-modulated BJT 302 is referred to as a "negative resistance" mode, also known as a negative differential transconductance (NDTC) mode. In the negative resistance mode, the QW-modulated BJT 302 may advantageously provide an amplifying function with a suitable load electrically coupled to the emitter 308.

Referring to FIG. 4, a first signal source, designated in FIG. 4 as $V_{SIGNAL\ 1}$, is electrically coupled to the QW control node 310, possibly through a first coupler, designated in FIG. 4 as COUPLER 1, for example a capacitor in combination with a first high frequency impedance component, designated in FIG. 4 as HIGH FREQUENCY IMPEDANCE 1, which may be a resistor. A second signal source, designated in FIG. 4 as $V_{SIGNAL\ 2}$, is electrically coupled to the base 304, possibly through a second coupler, designated in FIG. 4 as COUPLER 2, in combination with a second high frequency impedance component, designated in FIG. 4 as HIGH FREQUENCY IMPEDANCE 2. During operation of the semiconductor device 300, voltages on the collector power source $V_{COLLECTOR}$, on the base power source $V_{BASE}$, and on the voltage source $V_{CONTROL}$ coupled to the QW control node 310, are set to bias the QW-modulated BJT 302 in the negative resistance mode as described in reference to FIG. 3. Current through the collector 306 includes a component which is a product of the first signal source $V_{SIGNAL\ 1}$ and the second signal source $V_{SIGNAL\ 2}$. The QW-modulated BJT 302 may advantageously provide a mixing function with a suitable load electrically coupled to the emitter 308.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
   a substrate comprising a semiconductor material;
   a quantum well-modulated bipolar junction transistor (QW-modulated BJT), comprising:
     a base of a first conductivity type disposed in the semiconductor material;
     an emitter of a second, opposite, conductivity type abutting the base, disposed in the semiconductor material;
     a collector of the second conductivity type abutting the base, disposed in the semiconductor material;
     a quantum well control node disposed proximate to an area for a modulatable quantum well in the base, wherein the quantum well control node does not overlap the emitter or the collector; and
     a recombination site abutting the area for the modulatable quantum well a contact area of at least 25 square nanometers.

2. The semiconductor device of claim 1, wherein the semiconductor material is a silicon-containing Group IV semiconductor material.

3. The semiconductor device of claim 1, wherein the recombination site is a dielectric layer disposed on a surface of the base.

4. The semiconductor device of claim 1, wherein the quantum well control node is a gate disposed proximate to the area for the modulatable quantum well.

5. The semiconductor device of claim 4, wherein the gate has a physical width less than 40 nanometers.

6. The semiconductor device of claim 1, wherein:
   the semiconductor material extends to a top surface of the substrate;
   the base extends to the top surface;
   the area for the modulatable quantum well in the base extends to the top surface and has an average doping density of $1 \times 10^{15}$ cm$^{-3}$ to $3 \times 10^{18}$ cm$^{-3}$;
   the emitter is laterally adjacent to the base and extends to the top surface;
   the collector is laterally adjacent to the base and extends to the top surface;
   the recombination site is a gate dielectric layer disposed on the top surface, contacting the base; and
   the quantum well control node is a gate disposed over the gate dielectric layer over the area for the modulatable quantum well.

7. The semiconductor device of claim 6, wherein the base comprises:
   a first barrier region at least 10 nanometers wide disposed between the area for the modulatable quantum well and the emitter, the first barrier region having the first conductivity type with an average doping density greater than $3 \times 10^{18}$ cm$^{-3}$, and extending to the top surface; and
   a second barrier region at least 10 nanometers wide disposed between the area for the modulatable quantum well and the collector, the second barrier region having the first conductivity type with an average doping density greater than $3 \times 10^{18}$ cm$^{-3}$, and extending to the top surface.

8. The semiconductor device of claim 6, comprising an n-channel metal oxide semiconductor (NMOS) transistor and a p-channel metal oxide semiconductor (PMOS) transistor.

9. The semiconductor device of claim 1, wherein the first conductivity type is p-type and the second conductivity type is n-type.

10. The semiconductor device of claim 1, wherein the first conductivity type is n-type and the second conductivity type is p-type.

11. A process of forming a semiconductor device, comprising the steps:
    providing a substrate comprising a semiconductor material extending to a top surface of the substrate;
    forming a base of a QW-modulated BJT in the semiconductor material extending to the top surface, the base having a first conductivity type, the base comprising an area for a modulatable quantum well;
    forming barrier regions in the base on separate sides of the area for the modulatable quantum well, each barrier region being at least 10 nanometers wide and having average doping density greater than $3 \times 10^{18}$ cm$^{-3}$;
    forming an emitter of the QW-modulated BJT in the semiconductor material abutting the base, separated from the area for the modulatable quantum well by a first barrier region of the barrier regions, the emitter having a second, opposite, conductivity type;
    forming a collector of the QW-modulated BJT in the semiconductor material abutting the base, separated from the area for the modulatable quantum well by a second barrier region of the barrier regions, the collector having the second conductivity type;
    forming a gate dielectric layer on the top surface over the area for the modulatable quantum well, the gate dielectric layer providing a recombination site of the QW-modulated BJT with a contact area of at least 25 square nanometers to the area for the modulatable quantum well; and
    forming a gate over the gate dielectric layer over the area for the modulatable quantum well, the gate having a physical width less than 40 nanometers, the gate providing a quantum well control node of the QW-modulated BJT.

12. The process of claim 11, wherein the first conductivity type is p-type and the second conductivity type is n-type, and comprising the steps:
    forming a first implant mask over the substrate which exposes areas for the barrier regions and areas for source/drain extensions of a PMOS transistor;
    implanting p-type dopants into the substrate where exposed by the implant mask to form barrier implanted regions and source/drain extension implanted regions;
    removing the implant mask; and
    annealing the substrate to activate the p-type dopants in the barrier implanted regions to form the barrier regions and activate the p-type dopants in the source/drain extension implanted regions to form the source/drain extensions of the PMOS transistor.

13. The process of claim 11, wherein the first conductivity type is p-type and the second conductivity type is n-type, and comprising the steps:
    forming a first implant mask over the substrate which exposes an area for the emitter, an area for the collector, an area for a source of an NMOS transistor and an area for a drain of the NMOS transistor;
    implanting n-type dopants into the substrate where exposed by the implant mask to form an emitter implanted region, a collector implanted region, a source implanted region and a drain implanted region;
    removing the implant mask; and annealing the substrate to activate the n-type dopants in the emitter implanted region to form the emitter, activate the n-type dopants in the collector implanted region to form the collector, activate the n-type dopants in the source implanted region to form the source of the NMOS transistor, and activate the n-type dopants in the drain implanted region to form the drain of the NMOS transistor.

14. The process of claim 11, wherein the first conductivity type is n-type and the second conductivity type is p-type, and comprising the steps:
    forming a first implant mask over the substrate which exposes areas for the barrier regions and areas for source/drain extensions of an NMOS transistor;
    implanting n-type dopants into the substrate where exposed by the implant mask to form barrier implanted regions and source/drain extension implanted regions;
    removing the implant mask; and
    annealing the substrate to activate the n-type dopants in the barrier implanted regions to form the barrier regions and activate the n-type dopants in the source/drain extension implanted regions to form the source/drain extensions of the NMOS transistor.

15. The process of claim 11, wherein the first conductivity type is n-type and the second conductivity type is p-type, and comprising the steps:
    forming a first implant mask over the substrate which exposes an area for the emitter, an area for the collector, an area for a source of a PMOS transistor and an area for a drain of the PMOS transistor;
    implanting p-type dopants into the substrate where exposed by the implant mask to form an emitter implanted region, a collector implanted region, a source implanted region and a drain implanted region;
    removing the implant mask; and
    annealing the substrate to activate the p-type dopants in the emitter implanted region to form the emitter, activate the p-type dopants in the collector implanted region to form the collector, activate the p-type dopants in the source implanted region to form the source of the PMOS transistor, and activate the p-type dopants in the drain implanted region to form the drain of the PMOS transistor.

16. A process of operating a semiconductor device containing a QW-modulated BJT, comprising the steps:
    electrically coupling a reference node to an emitter of the QW-modulated BJT;
    setting a voltage of a base power source which is electrically coupled to a base of the QW-modulated BJT so as to forward bias a junction between the base and the emitter;
    setting a voltage of a collector power source which is electrically coupled to a collector of the QW-modulated BJT so as to reverse bias a junction between the collector and the base; and
    setting a voltage source which is electrically coupled to a quantum well control node of the QW-modulated BJT to a voltage, so as to form a quantum well in the base abutting a recombination site which has a contact area of at least 25 square nanometers with the base, so that a bipolar junction transistor formed by the emitter, base and collector is operating in a negative differential transconductance (NDTC) mode.

17. The process of claim 16, comprising coupling a signal source to the quantum well control node.

18. The process of claim 16, comprising coupling a signal source to the collector.

19. The process of claim 16, wherein the bipolar junction transistor of the QW-modulated BJT is an NPN bipolar junction transistor.

20. The process of claim 16, wherein the bipolar junction transistor of the QW-modulated BJT is a PNP bipolar junction transistor.

* * * * *